(12) United States Patent
Setterberg

(10) Patent No.: US 7,834,665 B2
(45) Date of Patent: Nov. 16, 2010

(54) TRACK-AND-HOLD CIRCUIT WITH ADJUSTABLE CHARGE COMPENSATION

(75) Inventor: Brian D. Setterberg, Menlo Park, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 59 days.

(21) Appl. No.: 11/873,414

(22) Filed: Oct. 17, 2007

(65) Prior Publication Data

US 2009/0102517 A1    Apr. 23, 2009

(51) Int. Cl.
 *G11C 27/02*  (2006.01)
(52) U.S. Cl. .......................................... 327/94; 341/122
(58) Field of Classification Search .................... 327/91, 327/93–96; 341/122–125
See application file for complete search history.

(56) References Cited

U.S. PATENT DOCUMENTS

| | | | | |
|---|---|---|---|---|
| 4,393,318 A * | 7/1983 | Takahashi et al. | ............. | 327/94 |
| 4,988,902 A * | 1/1991 | Dingwall | ............. | 327/382 |
| 6,147,522 A * | 11/2000 | Rhode et al. | ............. | 327/93 |
| 6,954,168 B2 * | 10/2005 | Hoskins | ............. | 341/155 |
| 2003/0020530 A1 * | 1/2003 | Lee et al. | ............. | 327/379 |
| 2003/0160714 A1 * | 8/2003 | Yoshinaga | ............. | 341/122 |

* cited by examiner

*Primary Examiner*—Lincoln Donovan
*Assistant Examiner*—Shikha Goyal

(57) ABSTRACT

A circuit design incorporates charge compensation devices within a Track-and-Hold (T/H) circuit to control channel charge generated by a tracking switch. Calibrating a T/H circuit requires selecting charge compensation devices from an array of similar devices to function within the T/H circuit to absorb charge ejected from the tracking switch. The charge compensation devices can also be pseudorandomly selected to operate within the T/H circuit. Charge compensation devices are used to enhance the performance of bottom-plate sampling systems as well as bootstrapped T/H circuits.

19 Claims, 9 Drawing Sheets

TRACK-AND-HOLD CIRCUIT WITH ADJUSTABLE CHARGE COMPENSATION

BACKGROUND OF THE INVENTION

Track-and-Hold (T/H) circuits are used in electrical engineering systems such as Analog-to-Digital Converters (ADC) to sample a time varying input signal. Two phases of a T/H circuit define its overall functionality; a track phase and a hold phase. Sampling the time varying input signal is done with a semiconductor switch and a sampling capacitor. A schematic representation of a simple T/H circuit is shown in FIG. 1.

In FIG. 1, an alternating current voltage source 10 is connected to a switch 12, generally referred to as a tracking switch, at node 11. The tracking switch is controlled by Clock signal 14 and connects the voltage source to a charge storage device, for example a capacitor 16 when the switch is turned on, defining the sampling instant. An output voltage is measured at node 18.

A track phase is defined when the Clock signal is logic level high ('high'). In this phase, the tracking switch is closed and the output voltage tracks the voltage source 10. A hold phase is defined when the Clock signal is logic level low ('low') and a sample instance of the input voltage is taken. In the hold phase, switch 12 is open circuited.

During the track phase, a charge is placed on capacitor 16 corresponding to the voltage at node 11. When the track phase ends (i.e. as the hold phase begins) the capacitor 16 holds a charge directly proportional to the value of the voltage source 10 at the instant the tracking switch is turned off.

Tracking switch 12 in a T/H circuit is commonly a Metal Oxide Semiconductor (MOS) device. MOS configurations used in a T/H circuit are Complementary MOS (CMOS), N-channel MOS (NMOS) or P-channel MOS (PMOS).

FIG. 2 is a detailed schematic that illustrates a T/H circuit conceptualized in FIG. 1. Tracking switch 12 from FIG. 1 is replaced by an NMOS device 22 and is detailed with charge flow represented by directional arrows 24 and 26. When the Clock signal 14 is high, a channel charge forms in the device 22, providing a conduction path between the nodes 11 and 18. When the Clock signal 14 transitions from high to low, the channel charge must exit the device 22 as indicated by the arrows 24 and 26. This charge is subsequently referred to as 'charge injection'.

When entering a hold phase (i.e. when the NMOS device 22 is open), a fraction of the total channel charge is injected towards the voltage source 10 as well as the capacitor 16 (indicated by reference numerals 24 and 26). A voltage step, or pedestal, at node 18 is created as a result of a residual channel charge 26 being injected towards node 18.

The T/H circuit shown in FIG. 1 and FIG. 2 is not ideal and exhibits significant performance issues. Various sources of errors are attributed to it; notably, the charge injected from the channel of NMOS switch 22 that induces a pedestal error at node 18 during the hold phase.

FIG. 3 is a schematic diagram that illustrates a solution in the art employed to overcome the problem of the charge injection towards the output voltage (reference numeral 26 in FIG. 2). Similar in design to the circuit shown in FIG. 2, it consists of an additional device, shown in FIG. 3 as an NMOS device 30, connected to the output of tracking switch 22. The NMOS device 30 has its drain and source nodes shorted together to allow node 18 to track the input voltage source (during the track phase). The control terminal of NMOS device 30 is connected to Second Clock 32, which is out of phase with Clock signal 14.

During the transition from the track phase to the hold phase, the NMOS device 22 injects channel charge 26 towards NMOS device 30. Soon after, triggered by the Second Clock 32 signal that is out of phase with the Clock 14 signal, a channel is also formed in the device 30. The goal in the prior art implementation of FIG. 3 is to choose the right size (channel area) of device 30, such that the charge required to form device 30's channel is precisely the same as charge 26. If device 30 is sized correctly, there will not be any residual pedestal at node 18.

However, this prior art is difficult to implement in practice during the design phase as finding the correct size of the compensation device is a non-trivial and error-prone exercise. As such, the prior art is inappropriate for low cost precision ADC systems where circuitry connected to node 18 can respond nonlinearly to a pedestal error. This can be a particular problem in low voltage IC processes. The nonlinear circuit response can manifest itself as harmonic distortion or intermodulation distortion of the signal.

FIG. 4 is a schematic diagram that illustrates another solution in the art by incorporating a bottom-plate sampling subcircuit. The T/H circuit in FIG. 4 is an improvement over that shown in FIG. 3 and has an additional NMOS switch 44 connected to the bottom-plate of capacitor 16. The control terminal of switch 44 is connected to Sample signal 42.

In the circuit described above, Sample 42 is brought to logic level low (prior to Clock 14 going to logic level low). This open-circuits the bottom-plate of capacitor 16, defining the sampling instant for this T/H circuit design. With the bottom-plate open-circuited, the charge stored on the capacitor remains constant, regardless of the voltage fluctuation on the output voltage node 18. With Sample held low, Clock 14 is then brought low (hold phase). Uncompensated channel charge 24 and 26 is distributed between the input node 11 and the output voltage node 18. Open circuiting the bottom-plate of capacitor 16 prevents the injected charge 26 from altering the charge stored on capacitor 16.

The Sample signal 42 is brought high (while Clock 14 is still low) to set a common-mode voltage reference for the capacitor's bottom-plate, thereby establishing a ground reference at node 18.

However, a parasitic capacitance 46 (of switch 44) prevents the bottom-plate of capacitor 16 from being completely isolated from the ground node. Capacitors 16 and 46 form a capacitive voltage divider, which allows a portion of the voltage pedestal at node 18 to be applied to capacitor 16, altering the sample charge stored on capacitor 16. Some of the uncompensated channel charge ejected from the tracking switch will find its way onto capacitor 16, introducing a signal dependent non-linearity.

FIG. 5A describes another solution in the art by incorporating a bootstrap circuit into the T/H. The circuit shown in FIG. 5 is similar to that in FIG. 2 with an additional voltage source 60 added between the control terminal of the tracking switch 22 and Clock line 14.

Bootstrapped T/H circuits arrange for the drive voltage on tracking switch 22 to track the input voltage source 10. This results in a gate-source voltage on the tracking switch that is constant from sample to sample. This serves to improve the linearity of the tracking switch. Inadequate compensation for the injected charge 26 in the circuit of FIG. 5A can result in a large pedestal error. In modern low-voltage circuit processes, this pedestal can often be large enough to shift the common-mode voltage range at node 18 outside of the valid operating range for circuitry that follows the T/H.

This limitation can be addressed with the addition of a charge compensation device 30 in FIG. 5B. The channel area of device 30 is selected to ensure that the magnitude of compensation charge 28 is sufficient to shift the output common-mode voltage into an optimal range for the circuitry that follows a bootstrapped T/H sub-circuit.

The prior art solutions shown above in FIGS. 3, 4 and 5B all require the compensation charge 28 to be precisely related to injected charge 26. The prior art solutions seldom achieve optimal performance, because determining the amount of uncompensated channel charge injected towards the output node is a complex function of parameters such as the relative impedance of the input voltage source and capacitance and the fall time of the Clock 14. To further compound the problem, circuit simulators neither model nor predict the charge injection phenomena with sufficient accuracy to reliably quantify the voltage pedestal prior to circuit fabrication.

Accordingly, there is a need for an improved way to accurately control the amount of charge compensation 28, and mitigate the expense and difficulty associated with finding the correct channel size of the charge compensation device.

DETAILED DESCRIPTION

As determining the amount of uncompensated channel charge injected towards the output node is complex, and a small amount of pedestal error can significantly affect the performance of circuits operating with low voltage supplies, a broader approach is required to remove pedestal error in T/H circuits. In the embodiments described below, at least one charge compensation device will necessarily be required to control the amount of injected charge that reaches the output node. Altering the effective channel area of the charge compensation devices facilitates mitigating the pedestal error in T/H circuits.

Variations to these embodiments will include calibrating the T/H circuit as a whole or pseudorandomly selecting charge compensation devices to operate within or out of the T/H.

An embodiment of the present invention is a Track-and-Hold (T/H) circuit with a programmable array of charge compensation devices to effectively counter the problem of charge injection. Charge compensation devices are placed at the output of a tracking switch. The T/H circuit as a whole is calibrated to minimize any signal dependent non-linearity due to charge injection.

The charge compensation devices can be MOS configurations known in the art. These are N-channel MOS (NMOS), P-channel MOS (PMOS) or Complementary MOS (CMOS). CMOS devices are NMOS and PMOS devices connected in parallel.

Figure 6A:
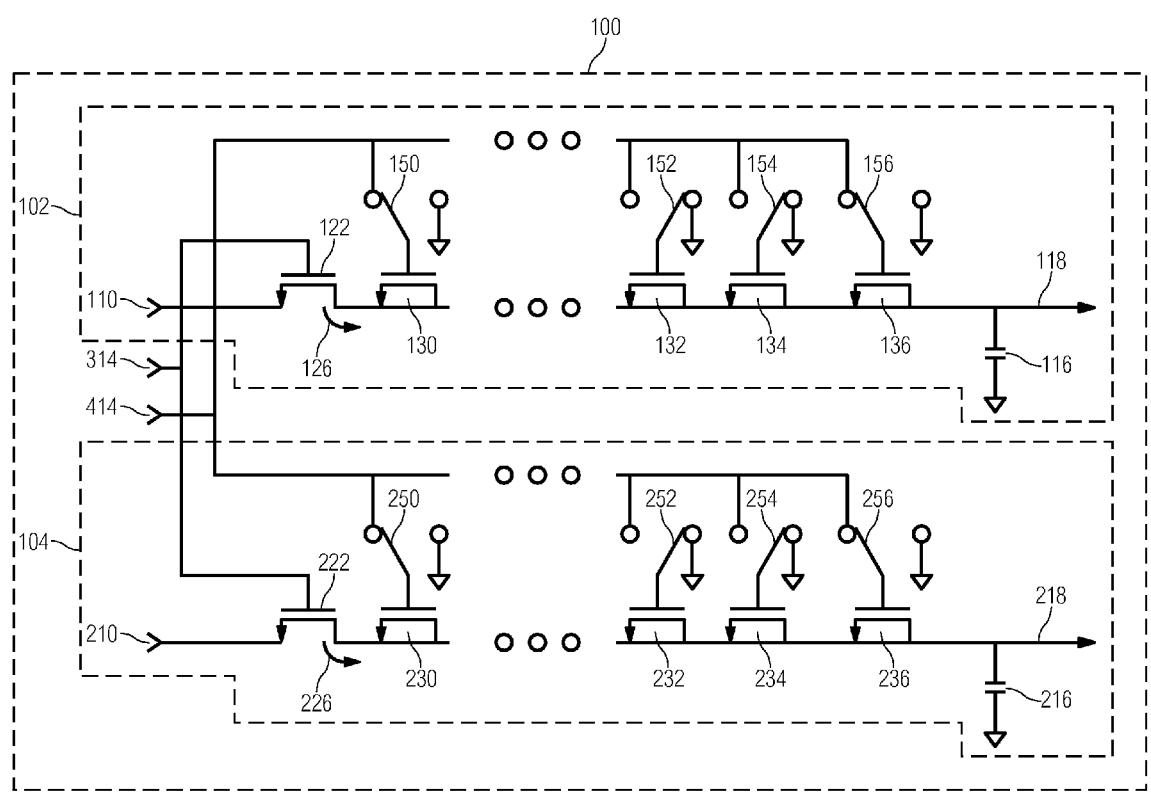
FIGS. 6A-B are schematic diagrams illustrating detailed embodiments of the present invention.

FIG. 6A is a schematic that describes one such embodiment of the invention in a pseudo-differential mode T/H circuit 100. This embodiment of the invention allows for channel charge injected from the tracking switch to be distributed over one or more compensating devices. The T/H circuit can be segmented into two identical halves; top half 102 and bottom half 104. Each half comprises a tracking switch, a charge storage device, an array of compensation devices and selector switches. A voltage source and two clock signals are shared between the top and bottom halves.

The aspect of the invention is replicated in both halves of the pseudo-differential mode T/H circuit 100. The aspect of present invention can also be incorporated within a single-ended T/H circuit or within a differential T/H circuit.

In top half 102, a voltage source 110 is connected to tracking switch 122. The control terminal of tracking switch 122 is connected to Clock 314.

A programmable array of charge compensation devices is connected at the output of tracking switch 122. In the top half, compensation devices 130, 132, 134 and 136 are shown at the output of tracking switch 122 and before a charge storage device, represented as a capacitor 116. These compensation devices are programmed to operate with the aid of selector switches 150, 152, 154 and 156.

In the bottom half 104, a voltage source 210 is connected to tracking switch 222. Voltage source 210 is an inverted representation of voltage source 110. Like its counterpart in the top half, tracking switch 222 is also controlled by Clock 314. An array of compensation devices 230, 232, 234 and 236 is placed after tracking switch 222 and before capacitor 216. These compensation devices are selected through selector switches 250, 252, 254 and 256.

The charge compensation devices have their drain and source terminals shorted together. This allows nodes 118 and 218 to respectively track input voltage sources 110 and 210 during the track phase. When the compensation devices form a channel, charge ejected from tracking switches 122 and 222 is absorbed by the array of charge compensation devices, thereby reducing the possibility of channel charge from tracking switches 122 or 222 from reaching their respective output nodes 118 and 218; subsequently minimizing the pedestal error at the output nodes.

Not all compensation devices in an array, either in the top or bottom half, need be selected to operate within T/H circuit 100. Charge compensation devices are selected as a calibration parameter (described later using FIG. 9) to accurately offset the negative consequences of channel charge injected towards the output voltage node (indicated as reference numeral 126 and 226). Calibrating the T/H circuit with an optimal number of charge compensation devices can eliminate pedestal error if so desired.

Figure 6B:
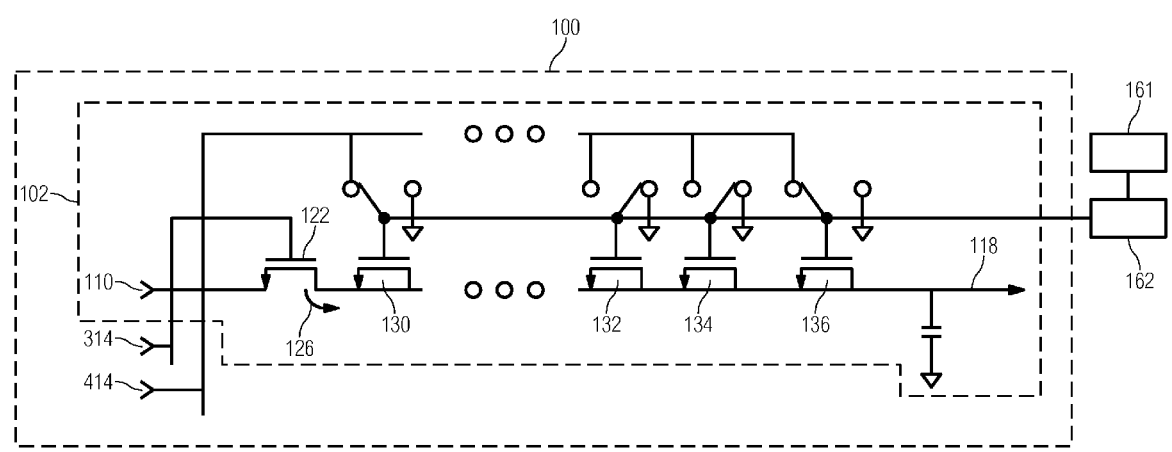

FIG. 6B is a diagram of a second embodiment of the inventive T/H circuit in a single-ended mode. The embodiment of FIG. 6B is similar to that of top half 102 in FIG. 6A and includes a device 161 to create a pseudorandom sequence and a control device 162 to select charge compensation devices 130-136 to operate within or out of the T/H circuit (described in detail below).

Device 161 is a pseudorandom number generator or a noise-shaping modulator, such as a delta-sigma modulator. For example, a pseudorandom number generator (PRNG) would supply a new pseudorandom number (PRN) for every track-and-hold cycle. The PRN determines which combination of charge compensation devices to use in a particular T/H cycle (also referred to as a sample) and provides a different PRN on a sample-by-sample basis.

When compensating charge injection 126 by charge compensation devices 130-136 in a random manner, the pedestal voltage at output node 118 is statistically uncorrelated to the input voltage 110. The pedestal energy has characteristics that resemble noise and contributes to an elevated noise floor that is within acceptable limits.

In the embodiments shown in FIGS. 6A-B, charge compensation devices selected to mitigate charge injection have their control terminals connected to a Second Clock 414, which is out of phase with the Clock 314. Conversely, charge compensation devices not intended to partake in mitigating charge injection have their control terminals connected to ground, deactivating them in T/H circuit 100. In another embodiment, for example a T/H circuit with PMOS device implementation, charge compensation devices not intended to partake in mitigating charge injection can have their control terminals connected to an appropriate power supply. In FIGS. 6A-B, charge compensation devices 130 and 136 are selected to function within the T/H circuit and have their control terminals connected to the Second Clock 414. Charge compensation devices 132 and 134 are not selected to mitigate channel charge.

In a hold phase, tracking switch 122 (of FIGS. 6A-B) injects channel charge 126 towards compensation devices 130 through 136. In this way, charge injection is offset by compensation devices 130 and 136 and is prevented from significantly altering output voltage at node 118. In the embodiment shown in FIG. 6A, the signal of interest is represented by the difference between nodes 118 and 218 from the top and bottom halves of the pseudo-differential T/H circuit 100. In the embodiment shown in FIG. 6B, output 118 is used as a single-ended output of the T/H circuit.

The amount of charge absorbed by a charge compensation device is directly proportional to the area of the device's channel. To enable finer resolution in offsetting charge injection during calibration, charge compensation devices are configured in unary-weighted, binary-weighted or in segmented array designs. These different array configurations allow the total area of the charge compensation devices to be programmed with sufficient accuracy and precision.

Figure 7:
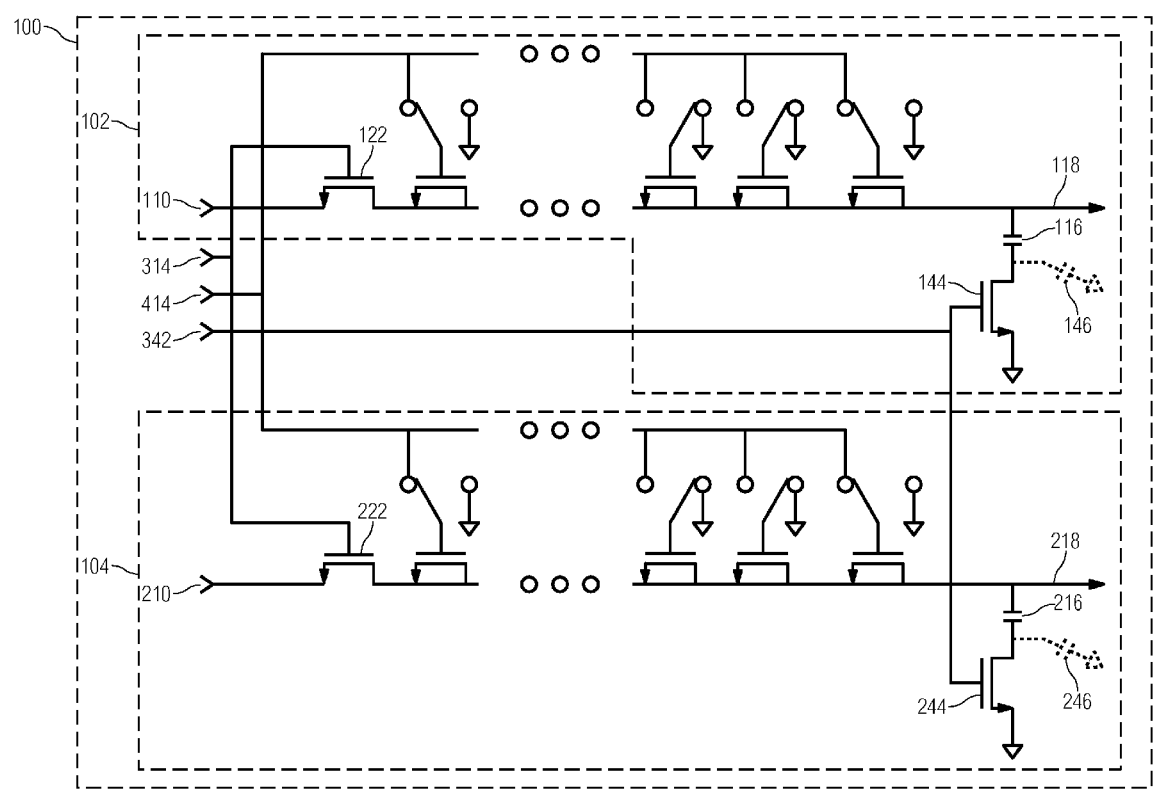
FIG. 7 is a diagram of a T/H circuit illustrating an embodiment of the present invention incorporating bottom-plate sampling.

Charge compensation devices can be incorporated into bottom-plate sampled and bootstrapped T/H circuits. FIG. 7 is a schematic diagram of a third embodiment of the invention incorporating bottom-plate sampling. The circuit in FIG. 7 is similar to that shown in FIG. 6A and has two additional NMOS switches 144 and 244 connected to the bottom-plate of capacitors 116 and 216 respectively. The control terminals of switches 144 and 244 are connected to Sample 342.

In the circuit described in FIG. 7, Sample 342 is brought low prior to Clock 314 going low. This open-circuits the bottom-plate of capacitors 116 and 216, defining the sampling instant. With the bottom-plate of both capacitors open-circuited, the charge stored on the capacitors ideally remains constant, regardless of the voltage fluctuation on the output voltage node 118 or 218. With Sample held low, Clock 314 is then brought low (hold phase). Clock 414 is brought high, forcing injected charge 126 or 226 to be partially compensated by the charge compensation devices that are situated between the input node 110 and output voltage node 118 in top half 102 or between input node 210 and output voltage node 218 in bottom half 104. Any uncompensated charge is distributed between the input nodes 110 and 210 and any parasitic capacitance on the output nodes 118 and 218.

Sample 342 is brought high (while Clock 314 is still low) to set a common-mode voltage reference for the capacitor bottom-plates, placing an accurate replica of the sampled voltage onto output nodes 118 and 218.

Charge injected from NMOS devices 144 and 244 will affect the voltage at the output nodes 118 and 218. However, this effect is benign because the injected charge is theoretically constant for every sample.

Figure 1:
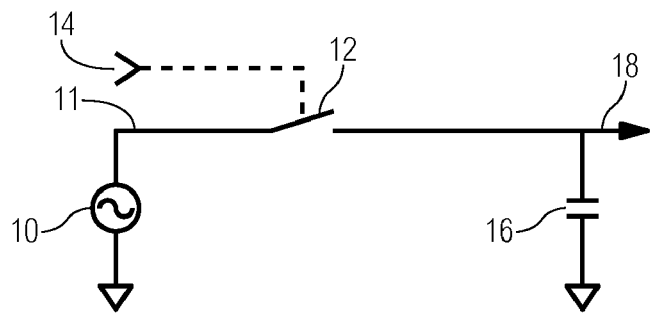
FIG. 1 is a diagram describing a simple Track-and-Hold (T/H) circuit common in the art.
Figure 2:
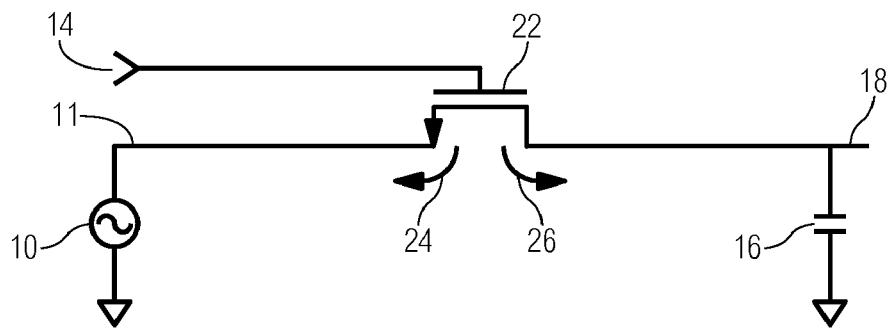
FIG. 2 is a schematic diagram describing a T/H circuit commonly used in the art, with an NMOS device as a tracking switch and illustrations of charge ejected from the NMOS device.
Figure 3:
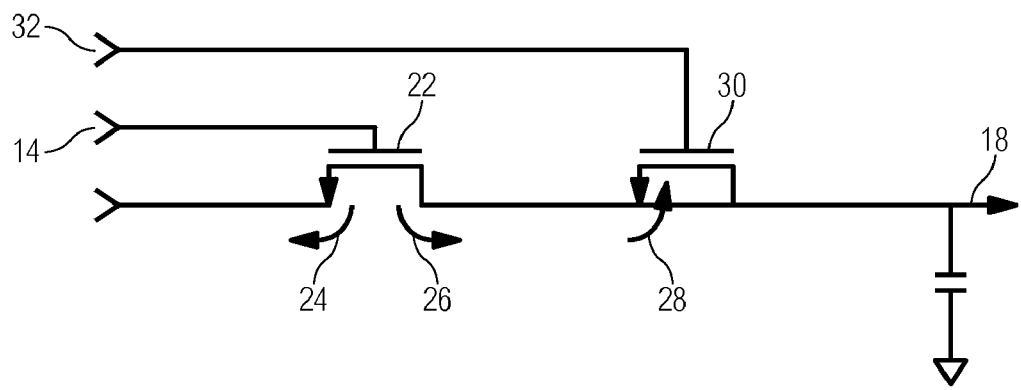
FIG. 3 is a diagram of a circuit commonly used in the art, describing a T/H circuit similar to that shown in FIG. 2 with an additional NMOS device to compensate for charge injection.
Figure 4:
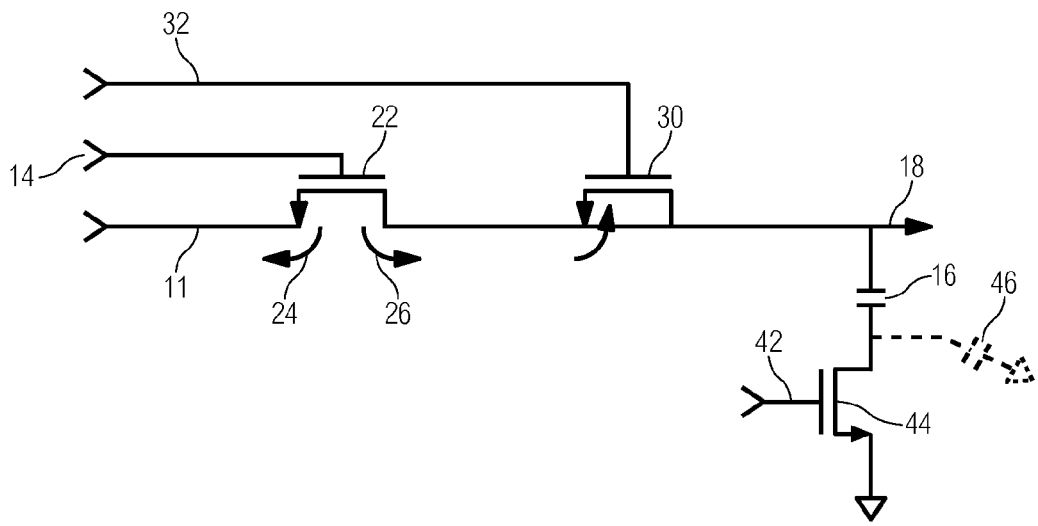
FIG. 4 is a diagram of a T/H circuit with bottom-plate sampling common in the art.
Figure 5A:
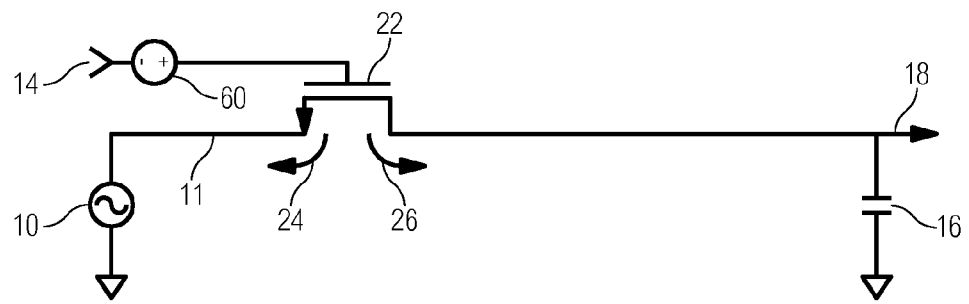
FIGS. 5A-B are diagrams of a T/H with a bootstrap supply voltage circuit known in the art.
Figure 5B:
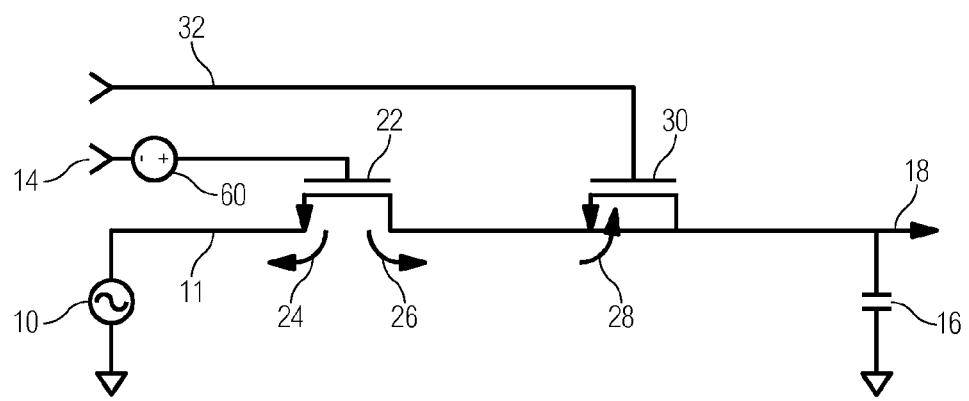

While the capacitors 116 and 216 are not ideally isolated from the ground node because of the parasitic capacitance 146 and 246, the programmable charge compensation scheme can be used to drive the non-linearity to acceptable levels when compared to a circuit without charge compensated bottom-plate architecture. By minimizing the impact of charge injection from the tracking switches 122 and 222, this embodiment of the invention attempts to further reduce channel charge that finds its way onto the capacitors 116 and 216. The programmable charge compensation scheme can therefore further reduce non-linearity associated with the traditional bottom-plate sampling architecture shown in FIG. 4.

Adding a bootstrapped voltage supply to the embodiment depicted in FIG. 7 can improve the linearity of the tracking switch.

Figure 8:
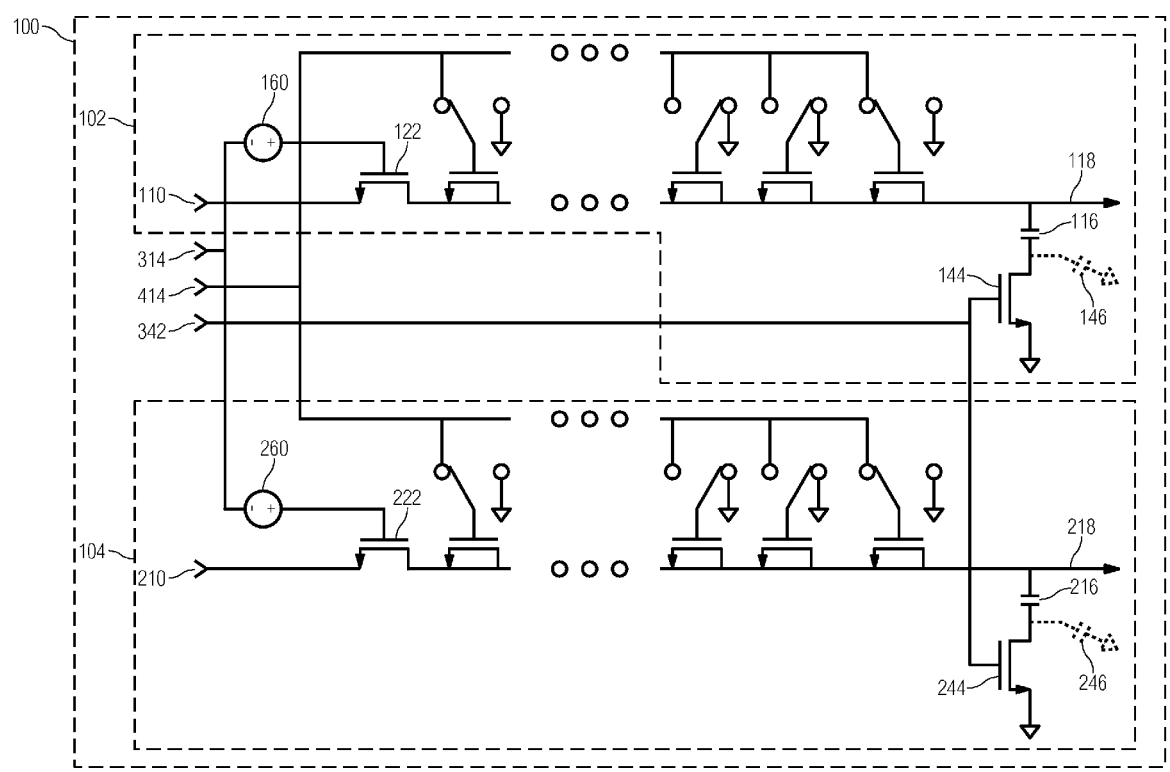
FIG. 8 is a diagram of a T/H circuit illustrating an embodiment of the present invention incorporating bottom-plate sampling as well as bootstrapped switch drivers.

FIG. 8 is a schematic diagram of a fourth embodiment of the invention incorporating bottom-plate sampling as well as a bootstrap voltage supply.

The circuit in FIG. 8 is similar to that in FIG. 7 and has an additional voltage source in each half (102 and 104) of the T/H circuit 100. In top half 102, voltage source 160 is located between the control terminal of the tracking switch 122 and Clock 314. The voltage at source 160 is set to track the input voltage source 110.

Similarly, a voltage source 260 is located between the control terminal of the tracking switches 222 and Clock 314. The voltage at source 260 is set to track the input voltage source 210.

Incorporating a bootstrapped voltage source in T/H circuit 100 as shown in FIG. 8, helps maintain a constant voltage differential at the gate and source (Vgs) terminals of tracking switches 122 and 222 at every Clock 314 cycle.

A constant Vgs on tracking switches 122 and 222 during the track phase improves the linearity of the switches because the switch resistance varies as a nonlinear function of Vgs. The constant Vgs eliminates this source of nonlinearity. This in turn minimizes the inconsistent amount of channel charge injected towards the output node during the track-to-hold transition.

In circuits where an intentional pedestal voltage at the output is desired, the embodiment of the invention described in FIG. 8 can be incorporated to shift the output common-mode voltage into an optimal range for the circuitry that follows a bootstrapped T/H sub-circuit.

Figure 9:
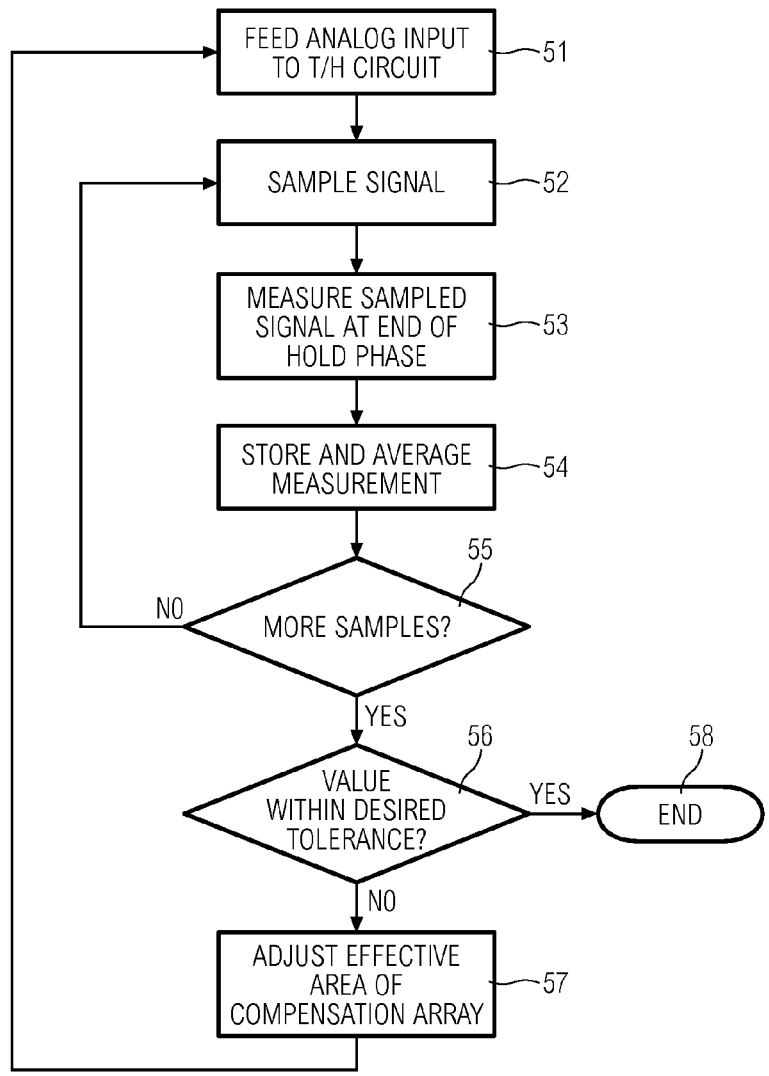
FIG. 9 is a flow chart describing an embodiment of a method of calibrating a T/H circuit.

FIG. 9 is a flow chart illustrating an embodiment of a method of calibrating a T/H circuit.

When calibrating a T/H circuit shown in the embodiments of FIGS. 6A, 7 and 8, an operator or an automated process can include or exclude compensating devices by comparing a controlled analog input signal with the output. Including or excluding compensating devices alters the area of the charge compensation devices selected (also referred to as effective channel area) to control pedestal error.

In FIG. 9, block 51 represents feeding an analog signal of a known magnitude into the input of an embodiment of the inventive T/H circuit (for example input 110 and 210 of FIG. 7) and acquiring the output signal 118 during the track phase. This is followed by sampling the signal in the T/H circuit in block 52 and measuring the sampled output signal 118 at the end of the hold phase in block 53. The measured value of the output signal is stored and averaged with subsequent measurements in block 54. If desired the sequence in blocks 51 through 54 may be repeated a number of times to reduce the variance of the measurement.

In block 56, the measured value of the signal is compared to the known input. If the measured value does not fall within a desired tolerance range of the known input value, the effective channel area of the charge compensation array is adjusted and the calibration sequence is repeated iteratively to adjust the output voltage towards the desired value.

The calibration procedure is repeated (block 51) until the output voltage is at the desired level. In most cases, this desired level is within an acceptable threshold range of the input voltage. Where the goal of calibration is to shift the common-mode level of the output signal with an appropriate amount of charge injection, the effective channel area is altered until the desired output voltage is realized.

Figure 10:
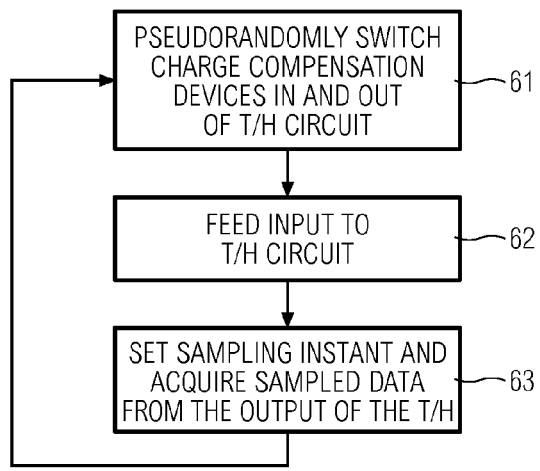
FIG. 10 is a flow chart describing an embodiment of a method where the charge compensation devices are pseudo-randomly switched in and out of a T/H circuit.

A second method embodiment of selecting charge compensation devices within a T/H circuit is depicted in the flow chart of FIG. 10. This method embodiment enables use of the apparatus embodiment of the invention without first calibrating it.

In this embodiment, charge compensation devices are pseudorandomly switched in and out of the T/H circuit (in block 61) before every sampling instant. This selection can be facilitated by using a pseudorandom number generator or a noise-shaping modulator, such as a delta-sigma modulator.

For example, the PRNG would supply a new pseudorandom number (PRN) for every track-and-hold cycle. The PRN determines the combination of charge compensation devices to be used for a particular track-and-hold cycle (i.e., sample). The PRNG provides a different PRN on a sample-by-sample basis.

An input signal is fed into the T/H circuit (block 62). In block 63, sampling is initiated and the output voltage of the T/H circuit is measured at the end of the hold interval.

The steps in block 61 to 63 are repeated for subsequent samples.

As mentioned above, when compensating charge injection by charge compensation devices in a random manner, the pedestal voltage at output node is statistically uncorrelated to the input voltage 110. The pedestal energy has characteristics that resemble noise and contributes to an elevated noise floor that is within acceptable limits.

Figure 11:
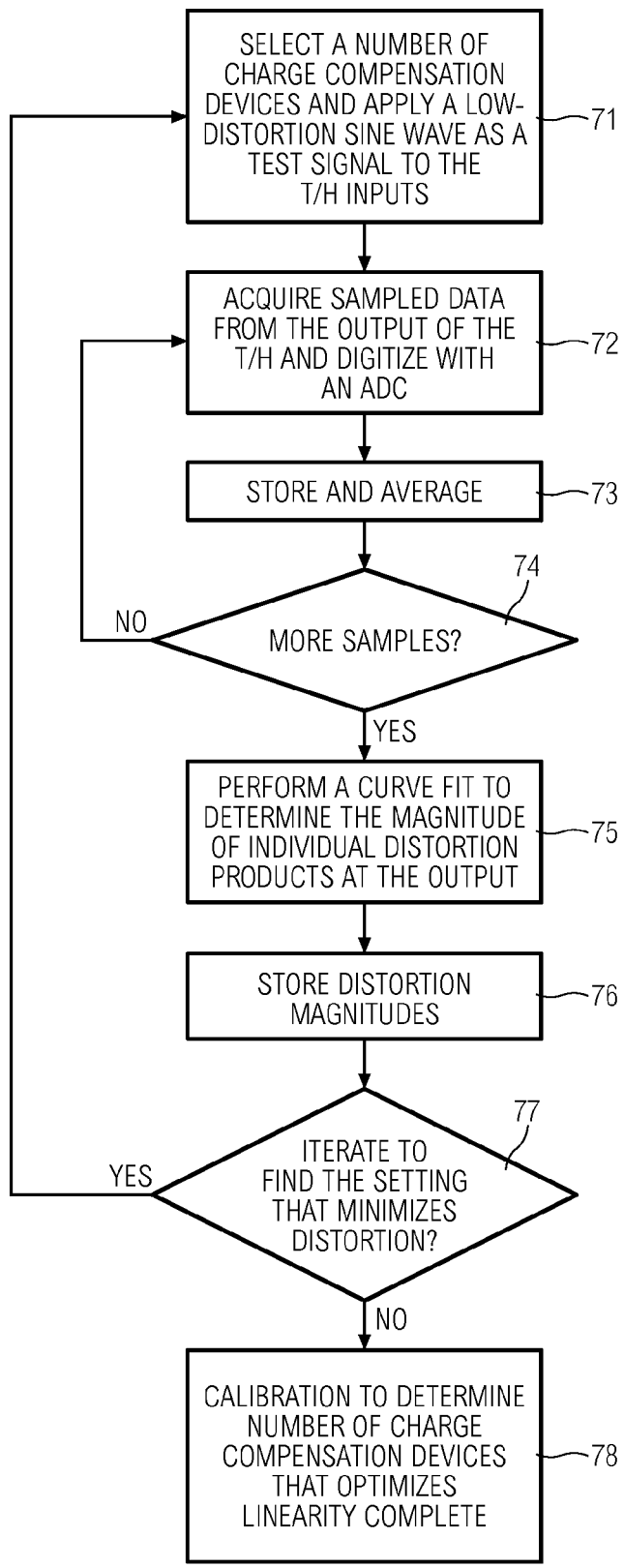
FIG. 11 is a flow chart describing another embodiment of a method of calibrating a T/H circuit.

FIG. 11 is a flow chart illustrating a third embodiment of a method of calibrating a T/H circuit.

The calibration procedure involves quantifying distortion products present on the output signal and adjusting the programmable charge compensation devices to minimize the energy in the distortion products. The goal of the calibration is to optimize linearity of the T/H circuit.

In block 71, a number of charge compensation devices are selected and a low-distortion sine wave is applied as a test signal to the T/H inputs. This is followed with block 72, which describes acquiring sampled data from the output of the T/H and subsequently digitizing the data with an ADC.

Block 73 describes storing and averaging the digitized data with subsequent cycles of the low-distortion sine wave. Block 74 instructs repeating blocks 72-73 until a sufficient number of cycles of the sine wave have been digitized and averaged.

Block 75 describes performing a curve fit to determine the magnitude of individual distortion products at the output. This can be done using a multiple linear regression (MLR) algorithm to extract the distortion terms.

Block 76 describes recording the distortion magnitudes for comparison.

Block 77 instructs repeating blocks 71-76 with a different number of charge compensation devices selected. This iteration is performed to find the number of charge compensation devices, and therefore the effective channel area that minimizes distortion.

Block 78 concludes the process with a determination of the ideal number of charge compensation devices that optimizes linearity.

Figure 12:
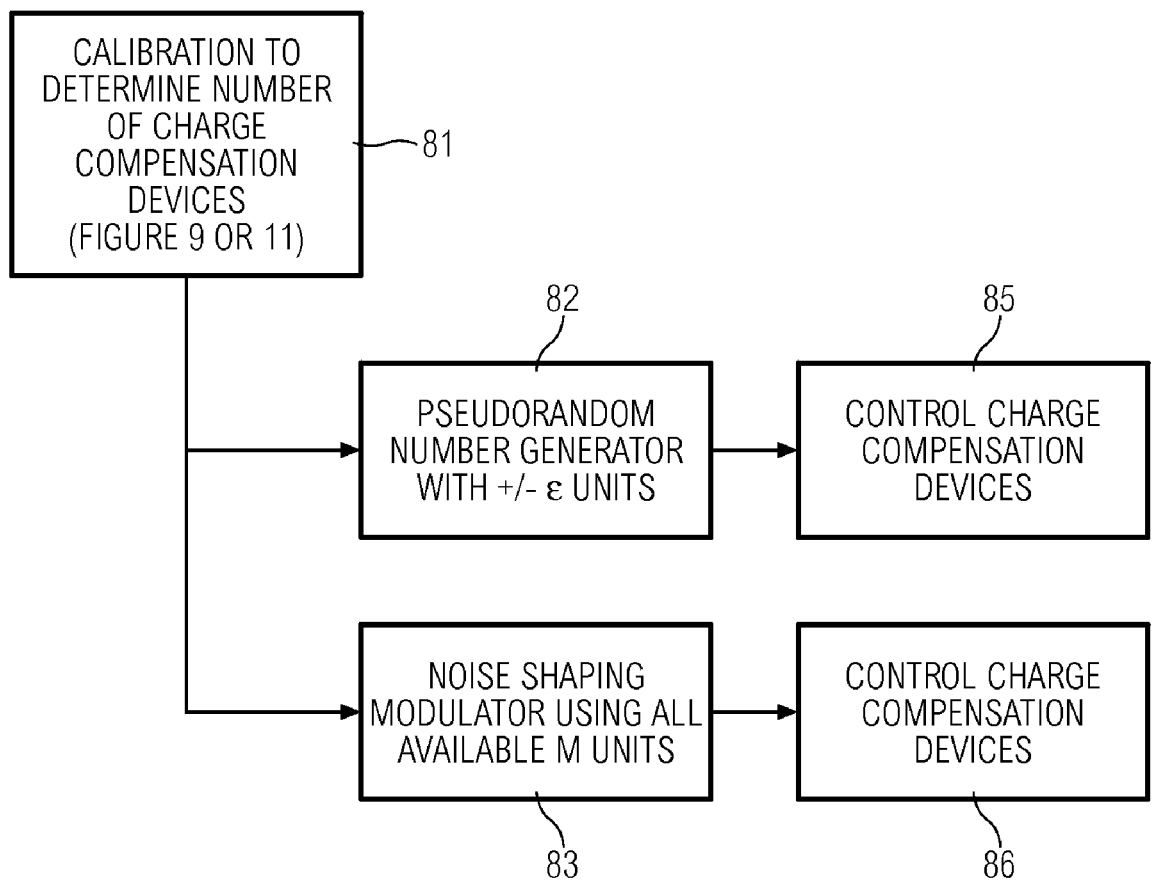
FIG. 12 is a flow chart describing an embodiment that combines the calibration methods of FIG. 9 or 11 with a method of adding dither in order to randomize quantization error of the charge compensation circuitry within a T/H circuit.

A fourth method embodiment to minimize pedestal voltage error is described in FIG. 12. This method combines the benefits of calibration methods described above with pseudorandomly switching charge compensation devices in and out of the T/H circuit to add dither. Dither is an intentionally applied form of noise to randomize residual uncompensated charge injection.

Initial calibration to determine the ideal number of charge compensation devices (or the effective channel area) is similar to that described in FIG. 9 or 11 (block 81). The option of adding dither is performed in one of two ways; by using a PRNG or a noise-shaping modulator and described in the following paragraphs. To illustrate the following paragraphs with an example, let one unit represent the smallest channel area possible of a charge compensation device. Allow X units to be effective channel area derived by the methods described in either FIG. 9 or 11.

In block 82, dither is injected into the T/H circuit with a PRNG. The PRNG selects a number of units based on a percentage of the effective channel area, example $\epsilon$ units, to add to or remove from the effective channel area. Thus, the area of charge compensation device units pseudorandomly selected can be as high as $X+\epsilon$ or as low as $X-\epsilon$. In this option of using a PRNG to add dither, the noise induced is white noise.

The output of the pseudorandom number generator is sent to a control device, similar to the control device 162 in FIG. 6B to control the selection of charge compensation devices (block 85).

Block 83 describes a noise-shaping modulator, a delta-sigma modulator for example, to perform dither. The noise-shaping modulator randomly selects charge compensation devices from all the charge compensation devices. If M represents the maximum channel area units available in the array of charge compensation devices, the noise-shaping modulator can randomly select charge compensation device units within a range of $-(M/2)$ to $+(M/2-1)$.

The output of the noise-shaping modulator is a pseudorandom sequence. The long-term average of this sequence will be equal to the value X, also referred to as the statistical mean of this sequence. A noise-shaping modulator has spectrally non-uniform noise shapes and is used for noise-shaping the uncompensated charge injection in the T/H circuit to thereby reduce the error within a frequency band.

Like the PRNG above, the output of the noise-shaping modulator is sent to a control device, similar to device 162 in FIG. 6B to control the selection of charge compensation devices (block 86).

While the embodiments described above constitute exemplary embodiments of the invention, it should be recognized that the invention can be varied in numerous ways without departing from the scope thereof. It should be understood that the invention is only defined by the following claims.

The invention claimed is:

1. A track-and-hold circuit comprising:
a tracking switch electrically connected to at least one charge compensation device, the tracking switch for switching, in response to a first signal, between a track phase of the track-and-hold circuit and a hold phase of the track-and-hold circuit;
a selector switch connected to at least one charge compensation device, the selector switch for switching the at least one charge compensation device between a state of switched into the track-and-hold circuit and a state of switched out of the track-and-hold circuit;
wherein when the at least one charge compensation device is in the state of switched into the track-and-hold circuit, the at least one charge compensation device is able to receive a second signal causing it to absorb excess charge emitted by the tracking switch; and
wherein when the at least one charge compensation device is in the state of switched out of the track-and-hold circuit, the at least one charge compensation device is unable to receive the second signal.

2. The circuit of claim 1, further comprising:
a charge storage device electrically connected to the tracking switch, the charge storage device to store charge during the track phase and maintain a charge when in the hold phase; and
an electrical source electrically connected to the charge storage device during the track phase of the track-and-hold circuit for supplying charge to the charge storage device through the tracking switch in response to the first signal.

3. The circuit of claim 1, wherein the at least one charge compensation device is chosen pseudorandomly to operate in the state of switched into or the state of switched out of the track-and-hold circuit.

4. The circuit of claim 1, whereby the track-and-hold circuit is calibrated to eliminate the excess charge by selecting the at least one charge compensation device to operate in the state of switched into or the state of switched out of the track-and-hold circuit, and the calibrated track-and-hold circuit having a programmable charge compensation array with an effective channel area.

5. The track and hold circuit of claim 1, wherein the at least one charge compensation device comprises two or more charge compensation devices configured in a unary-weighted, binary-weighted or in a segmented array configuration.

6. The circuit of claim 2, further comprising a bottom-plate switch, the bottom-plate switch responsible for floating the charge storage device.

7. The circuit of claim 2, further comprising a bootstrap voltage source for maintaining a constant voltage difference between the first clock and the electrical source.

8. The circuit of claim 7, wherein the bootstrap voltage source tracks the electrical source.

9. The circuit of claim 1, wherein the at least one charge compensation device is selected from a group consisting of an NMOS device, a PMOS device, and a CMOS device.

10. A method for reducing pedestal voltage at an output of a track-and-hold circuit, the circuit having an array of charge compensation devices, comprising:
selecting from the array of charge compensation devices a number of charge compensation devices, the selected number of charge compensation devices having an effective channel area;
feeding a signal input to a tracking switch of the track-and-hold circuit, the tracking switch being connected to the selected number of charge compensation devices at the output; and
measuring a voltage at the output.

11. The method of claim 10, further comprising generating a pseudorandom sequence; and
switching in and out of the track-and-hold circuit charge compensation devices on a sample-by-sample basis using the pseudorandom sequence.

12. The method of claim 10, further comprising:
determining a difference between the voltage at the output and the signal input; and
altering the effective area to reduce the difference.

13. The method of claim 12, further comprising generating a pseudorandom sequence; and
altering the effective channel area by switching in and out of the track-and-hold circuit charge compensation devices from the array of charge compensation devices on a sample-by-sample basis using the pseudorandom sequence.

14. The method of claim 13, wherein the pseudorandom sequence is generated by a pseudorandom number generator, the pseudorandom sequence being derived using a range of numbers based on a percentage of the effective channel area.

15. The method of claim 13, wherein the pseudorandom sequence is generated by a noise-shaping modulator, the pseudorandom sequence derived from a range of numbers based on a total channel area of the array of charge compensation devices.

16. The method of claim 10, wherein the signal input is a low-distortion signal.

17. The method of claim 10, wherein measuring the voltage at the output comprises:
digitizing the voltage at the output with an Analog-to-Digital converter; and
performing a curve fit to determine a magnitude of individual distortion products at the voltage at the output.

18. The method of claim 10, wherein the voltage at the output is measured at an end of a hold phase of the track-and-hold circuit.

19. The method of claim 10, wherein the array of charge compensation devices are selected from a group consisting of NMOS devices, PMOS devices, and CMOS devices.

* * * * *